(12) United States Patent
Yahiro

(10) Patent No.: US 6,277,532 B1
(45) Date of Patent: Aug. 21, 2001

(54) CHARGED-PARTICLE-BEAM MICROLITHOGRAPHIC METHODS FOR CORRECTION OF RETICLE DISTORTIONS

(75) Inventor: Takehisa Yahiro, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/418,117

(22) Filed: Oct. 14, 1999

(30) Foreign Application Priority Data

Oct. 14, 1998 (JP) .................................................. 10-306397

(51) Int. Cl.⁷ ................................ G03F 9/00; G03C 5/00
(52) U.S. Cl. ................................ 430/30; 430/22; 430/296
(58) Field of Search ................................ 430/30, 22, 296

(56) References Cited

U.S. PATENT DOCUMENTS 5,260,151 * 11/1993 Berger et al. ............................. 430/5

* cited by examiner

*Primary Examiner*—Christopher G. Young
(74) *Attorney, Agent, or Firm*—Klarquist Sparkman Campbell Leigh & Whinston, LLP

(57) ABSTRACT

Charged-particle-beam (CPB) projection-exposure methods, apparatus, and reticles are disclosed that can be used for efficiently and accurately measuring and correcting various reticle distortions. A reticle is segmented into multiple exposure units grouped into stripes. In a stripe, peripheral exposure units define second alignment marks for measuring reticle distortion arising from loading the reticle in the CPB projection-exposure apparatus. The reticle includes struts arranged into a grillage separating individual exposure units from one another. The struts define first alignment marks for measuring reticle distortion arising from reticle fabrication. The positions of the first alignment marks are measured in advance to obtain distortion data for each respective exposure unit. After loading the reticle in the CPB projection-exposure apparatus, the positions of the second alignment marks 51 are measured to obtain data on reticle distortion arising from loading the reticle. These data are used to calculate the actual distortion of each exposure unit, and projection parameters are adjusted to correct for such actual distortion during projection-exposure.

11 Claims, 7 Drawing Sheets

LITHOGRAPHY STEP

CHARGED-PARTICLE-BEAM MICROLITHOGRAPHIC METHODS FOR CORRECTION OF RETICLE DISTORTIONS

FIELD OF THE INVENTION

This invention relates to charged-particle-beam microlithographic projection-exposure methods and apparatus as used for transferring a pattern, defined by a reticle, onto to a sensitive substrate (e.g., a semiconductor wafer or the like) using a charged particle beam (e.g., an electron beam or ion beam). The invention also relates to reticles used in such apparatus and methods. More specifically, the invention relates to such methods and apparatus providing rapid and accurate corrections of reticle distortions caused by any of various factors.

BACKGROUND OF THE INVENTION

Conventional methods and apparatus are described in connection with electron-beam microlithography as an example of charged-particle-beam (CPB) microlithography. Electron-beam microlithography provides higher resolution than optical microlithography (e.g., microlithography using ultraviolet light), but exhibits much lower throughput (number of wafers that can be processed per unit time) than optical microlithography. A variety of technology development efforts have been directed to solving the throughput problem, however, and certain techniques (such as "cell projection" techniques) offering advantages in this regard are now becoming practical. Unfortunately, the cell projection technique has limited applicability because it is utilized mainly for manufacturing chips having large areas in which a basic circuit configuration (such as a memory cell) is repeated a large number of times.

Other current techniques, however, still suffer from extremely low throughput. For example, in the "partial pattern block exposure" technique, repeated exposures of each of a limited number of different pattern portions (each representing a respective recurring portion of the overall device pattern) are performed. The throughput realized with this technique is at least an order of magnitude too low for practical production-level semiconductor wafer-exposure applications.

Another conventional technique is electron-beam "reduction-transfer." One type of reduction transfer, termed full-field reduction transfer, offers prospects of a vastly improved throughput over the partial pattern block exposure technique. In full-field reduction transfer, a reticle defining an entire chip pattern (i.e., the entire pattern for a layer of a semiconductor chip as formed on a wafer) is illuminated with an electron beam. A "reduced" (i.e., demagnified) image of the pattern residing within the field of illumination is projected by a projection lens, situated downstream of the reticle, onto the wafer. As can be surmised, the electron optics used with such a system must accommodate a very large field. Unfortunately, however, it has been impossible to date to provide an electron-optical system having a sufficiently large field and that exhibits satisfactory aberration control, especially in peripheral regions of the field. Thus, it has not been possible to achieve the desired image quality on the wafer over a field large enough to encompass the entire pattern in one shot.

Accordingly, another reduction transfer technique (termed "divided" or "partitioned" reduction transfer) has been proposed in which the total area of the pattern, as formed on the reticle, is partitioned into many small portions (termed "exposure units" or "subfields"). (The reticle is thus termed a "divided" or "segmented" reticle.) The individual exposure units are sequentially illuminated and transferred. The corresponding images of the individual exposure units on the wafer are located so as to be "stitched together" in a prescribed arrangement on the wafer to complete the transfer of the entire pattern. In this regard, reference is made to U.S. Pat. No. 5,260,151, incorporated herein by reference, and to Japanese published patent application no. Hei 8-186070 for examples of divided reduction transfer.

Two main types of reticles, stencil reticles and membrane reticles, are used in divided reduction transfer. An especially useful reticle is the so-called "scattering-stencil" reticle, that is fabricated by micromachining a pattern of feature-defining voids (through-holes) in a "reticle membrane" (typically a silicon film approximately 1 to 5 $\mu$m thick). Electrons of an "illumination beam" (electron beam used to individually illuminate the exposure units) pass through the voids in the membrane of a scattering-stencil reticle without being scattered. Electrons of the illumination beam that strike the membrane itself usually pass through the membrane but are highly scattered during passage. To prevent these scattered electrons from reaching the wafer, a "contrast aperture" is placed at or near the beam-convergence plane of a projection lens located between the reticle and the wafer (the beam-convergence plane of the projection lens is the Fourier plane for the reticle plane). Electrons divergently scattered by passage through the reticle membrane are absorbed by the contrast aperture, while electrons that pass through the contrast aperture are imaged on the wafer. Thus, contrast in the projected image is achieved.

During fabrication a reticle encounters various delineation and etching steps. These steps tend to distort the reticle. In addition, the reticle can be distorted by electrostatic chucking, for instance, whenever the reticle is mounted on a reticle stage of the microlithographic projection-exposure apparatus. An exposure performed with a distorted reticle will produce a distorted pattern on the wafer, thus degrading accuracy of overlay registration and stitching.

SUMMARY OF THE INVENTION

The present invention solves the above-summarized problem with conventional methods and apparatus. A segmented reticle is provided with alignment marks permitting reticle-distortion measurements to obtained in advance of loading the reticle into a charged-particle-beam (CPB) projection-exposure apparatus. The reticle also includes alignment marks for measuring reticle distortion after loading the reticle. During exposure of the reticle pattern, certain projection-optical system parameters such as demagnification ratio, image rotation, and image positioning can be adjusted, based on these measurements, to correct the distortion.

According to a first aspect of the invention, CPB projection-exposure methods are provided. Such methods include the steps of defining a pattern, to be transferred to a sensitive substrate, on a reticle segmented into multiple exposure units (termed "subfields" herein) each defining a respective portion of the pattern. The subfields are individually illuminated using a charged-particle illumination beam to form a patterned beam propagating downstream of the reticle. The patterned beam is projection-imaged on desired respective locations on the sensitive substrate at which images of the subfields are stitched together to form the pattern. Further according to a representative embodiment, reticle distortion is measured and corrected. To such end, first alignment marks are defined on the reticle for measuring distortion of the reticle arising during fabrication of the reticle. Also, second alignment marks, separate from the first alignment marks, are defined on the reticle for measuring distortion of the reticle arising from mounting the reticle on a reticle stage for use in projection-exposure of the pattern defined by the reticle. Positions of the first alignment marks are measured to obtain data corresponding to a subfield-by-subfield profile of reticle distortion caused by fabrication of the reticle. The reticle is mounted on the reticle stage. Then, positions of the second alignment marks are measured to obtain data corresponding to a profile of reticle distortion caused by mounting the reticle on the reticle stage. The data from measurements of the first and second alignment marks are combined and processed to obtain a measurement of an actual distortion of each exposure unit of the reticle. During projection-exposure of the subfields, any actual distortion of respective subfields is corrected as required by adjusting respective exposure parameters under which the respective subfields are exposed.

The reticle desirably comprises a grillage comprising intersecting struts separating individual subfields from one another. Each subfield of the reticle desirably comprises a respective membrane portion extending between respective struts such that each membrane portion is peripherally flanked by struts of the grillage. The first alignment marks are desirably defined on the grillage. The first alignment marks are desirably configured so as to provide a set of first alignment marks for each subfield of the reticle. Further desirably, the positions of the first alignment marks are detected using light.

The reticle further comprises a grillage comprising intersecting struts separating individual subfields from one another. In such a configuration, each subfield of the reticle comprises a respective membrane portion extending between respective struts such that each membrane portion is peripherally flanked by struts of the grillage. In such a reticle, the second alignment marks are defined within multiple subfields. A reference mark is desirably provided on a substrate stage or on a substrate mounted to the substrate stage. The second alignment marks are illuminated by a charged particle beam such that the reference mark is scanned by the charged particle beam passing through an individual second alignment mark and projection-imaged on the sensitive substrate.

The subfields desirably are arrayed in rows and columns on the reticle, wherein the reticle comprises at least one stripe comprising multiple rows and columns of subfields. In such a configuration, the second alignment marks are defined in subfields situated around a periphery of the stripe. The second alignment marks can be stencil marks defined in the membrane portion of the respective subfield.

According to another aspect of the invention, apparatus are provided for performing microlithographic projection-exposure of a pattern, defined on a segmented reticle, onto a sensitive substrate using a charged particle beam. Such an apparatus comprises an illumination optical system for illuminating a charged-particle illumination beam onto an individual subfield of the reticle so as to illuminate the subfield. (The subfield defines a respective portion of the pattern defined by the reticle.) A projection-optical system projection-images, at a corresponding location on the sensitive substrate, a charged-particle patterned beam formed by passage of the illumination beam through the illuminated subfield. Thus, an image of the illuminated subfield is formed on a corresponding location on the sensitive substrate. The locations of the subfield images on the substrate are such that the subfield images are stitched together to form the pattern on the substrate. The apparatus utilizes a reticle segmented into multiple subfields, wherein at least some of the subfields define first alignment marks configured and situated for measuring reticle distortion arising during fabrication of the reticle. Also, at least some of the subfields define second alignment marks configured and situated for measuring reticle distortion arising from loading the reticle in the exposure apparatus. The apparatus also includes a reticle stage to which the reticle is mounted for performing a projection-exposure of the reticle pattern.

The apparatus also includes the following means:

(1) for performing, prior to loading the reticle on the reticle stage, measurements of respective positions of the first alignment marks to obtain reticle-distortion data for each of the respective subfields, the data corresponding to a distortion of the reticle arising during manufacture of the reticle;

(2) for performing, after loading the reticle on the reticle stage, measurements of respective positions of the second alignment marks to obtain reticle-distortion data for each of the respective subfields, the data corresponding to a distortion of the reticle arising from mounting the reticle on the reticle stage;

(3) for calculating, from the data corresponding to a distortion of the reticle arising during manufacture and the data corresponding to distortion of the reticle due to loading the reticle, an actual distortion of the reticle for each subfield defining a respective portion of the pattern; and (4) for adjusting, based on the actual distortion of the reticle, at least one parameter of the projection-optical system as required to impart a correction to an image of an illuminated subfield on the substrate.

According to another aspect of the invention, reticles are provided for performing charged-particle-beam microlithography. A representative embodiment of such a reticle comprises a pattern to be transferred to a sensitive substrate, wherein the pattern is segmented into multiple exposure units on the reticle. The reticle also includes multiple first and second alignment marks. The first alignment marks are situated and configured for measuring reticle distortion arising during fabrication of the reticle. The second alignment marks are situated and configured for measuring reticle distortion caused by loading of the reticle on a reticle stage of a charged-particle-beam microlithography apparatus.

As a segmented reticle, each exposure unit thereof desirably comprises a respective membrane portion flanked by struts of a grillage. The struts surround the respective membrane portion and defining first alignment marks for the respective exposure unit. The first alignment marks are desirably optical alignment marks detectable using light.

The respective membrane portion of each of at least certain of the exposure units desirably defines respective second alignment marks. A group of exposure units on the reticle is desirably arranged in rows and columns of a stripe, wherein the exposure units of the stripe that define respective second alignment marks are peripheral exposure units of the stripe.

The aspects of the invention summarized above facilitate correction, subfield-by-subfield, of distortion of a reticle in situ, while the reticle is chucked on the reticle stage in the projection-exposure apparatus. Hence, it is now possible to perform extremely accurate projection-exposures even when the reticle is distorted.

During exposure of each subfield, corrections of respective distortions of the reticle are performed by computing errors in position, rotation, and demagnification ratio for each subfield. These calculations are performed using data from measurements of reticle distortion obtained with the reticle not mounted in the reticle stage and with the reticle mounted in the reticle stage. The results of such calculations are routed back to various deflectors, rotation-correction lenses, and demagnification-ratio-correction lenses, as required, of the exposure apparatus.

A fairly detailed profile (encompassing the entire reticle) of reticle distortion (i.e., deviations from ideal design values) can be obtained before the reticle is loaded on the reticle stage in the projection-exposure apparatus. For example, such a profile can be obtained during reticle fabrication by detecting the positions of the first alignment marks. These measurements can be performed, for example, using a coordinates-measurement system.

After the reticle is loaded in the projection-exposure apparatus, the positions of second alignment marks, placed in strategic locations on the reticle, can be measured by a technique such as TTR (through-the-reticle) measurement, for example. To perform TTR measurements, the CPB source is used to make an actual exposure used to determine overall distortion of the entire reticle. The data from such measurements are combined and used to determine an amount of correction required for the position, demagnification ratio, image rotation, etc., for each subfield. Through interpolation, the values for corrections at points between alignment marks can also be found.

The practice of taking of detailed measurements of various parts of the reticle in advance outside of the exposure apparatus and then measuring the overall deformation of the reticle inside the exposure equipment reduces the time required to measure the in-situ distortion and compute the corrections.

The reticle can comprise one or more subfields each having a membrane. Grillage (support structure) around the perimeter of each membrane, and first alignment marks can be formed on the grillage. Because grillage is present near each subfield (but in locations that are not subjected to CPB exposure), the grillage is a preferred location for placement of the first alignment marks.

First alignment marks can be formed for each subfield. Since exposure radiation and optical-parameter corrections are addressed at the subfield level, for best exposure accuracy it is preferred that data on reticle distortion also be acquired at the individual subfield level.

As noted above, the first alignment marks are desirably optical alignment marks detected using light. Measurements of optical coordinates can be performed using equipment that is commonly used and easy to operate and maintain.

The second alignment marks are desirably "CPB alignment marks" detected using the charged particle beam. The second alignment marks are desirably detected using a reference mark provided on the substrate stage or on a test substrate. The second alignment marks are scanned by a charged particle beam passing through the marks and projection-imaged on the reference mark. Thus, a determination is made of an actual distortion of the reticle that occurred during loading of the reticle onto the reticle stage. Hence, there is no need to install special detectors for in situ detection of reticle distortion in the projection-exposure apparatus. It is also possible, according to this configuration, to detect and correct errors in the projection optical system and in the substrate stage.

The second alignment marks are desirably "stencil marks" comprising voids defined in the reticle membrane. The stencil marks can be CPB (e.g., electron-beam) stencils. CPB stencils are preferred because they do not require a reticle microscope.

As noted above, the subfields of the pattern are desirably arranged into stripes each containing multiple rows and columns of subfields. The subfields each have a width and/or length that is within the field of the illumination-optical system. The second alignment marks are desirably formed in peripheral subfields of each stripe. Hence, schemes involving situating special alignment subfields in the center regions of stripes (that are then exposed while the charged particle beam is deflection-scanned while the stages are synchronously actuated) are avoided. As a result, smoother scanning and adjustment of the optical and stage systems can be achieved, which avoids unnecessary loss of throughput.

The foregoing and additional features and advantages of the invention will be more readily apparent from the following detailed description, which proceeds with reference to the accompanying drawings.

DETAILED DESCRIPTION

Figure 3:
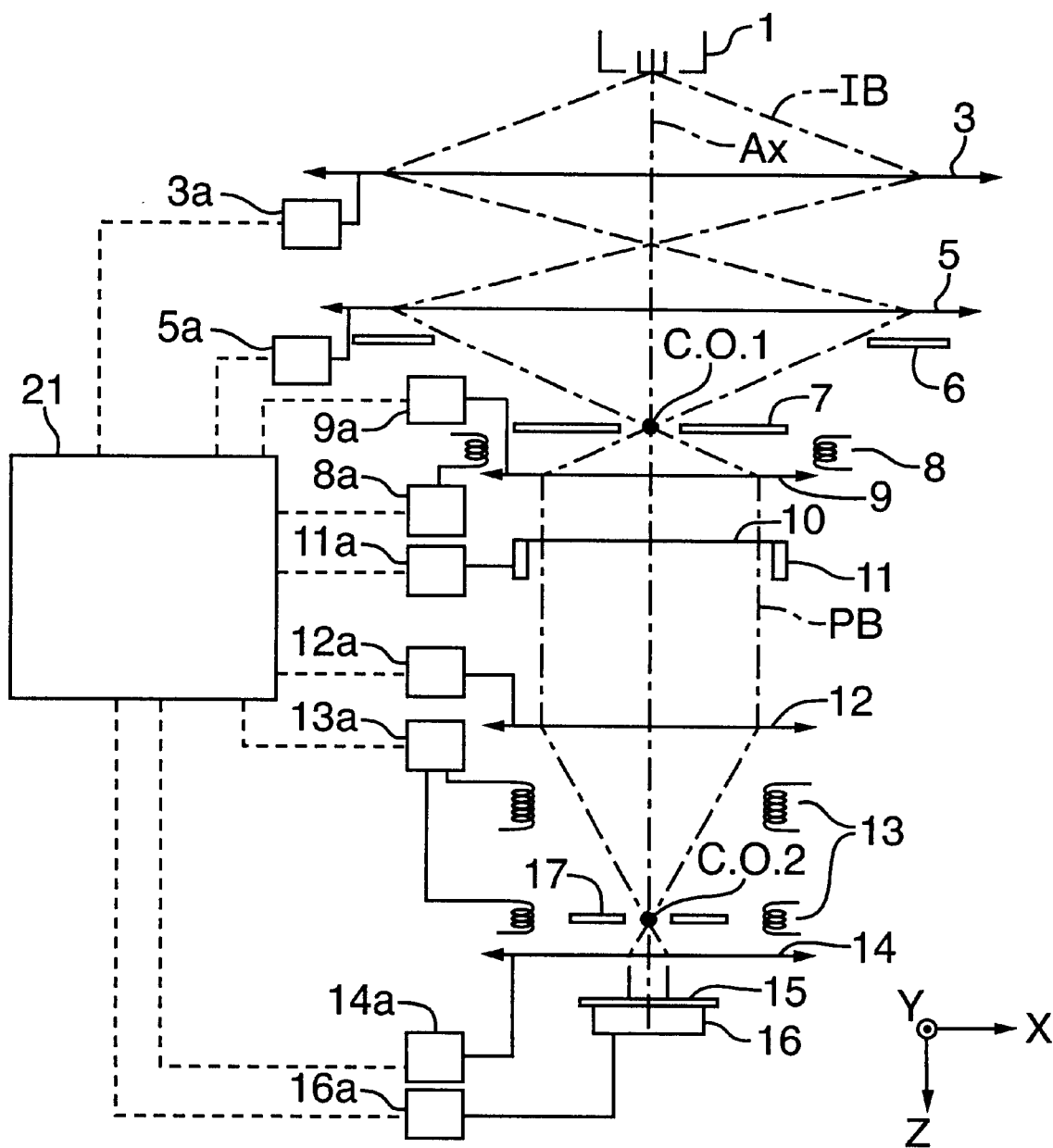
FIG. 3 is a schematic elevational view showing certain imaging relationships and control systems in the electron-optical system of a representative embodiment of an electron-beam projection-exposure apparatus according to the invention.

Certain features of a microlithographic projection-exposure apparatus employing an electron beam (as a representative charged particle beam) are depicted in FIG. 3. FIG. 3 also shows imaging relationships in the overall electron-optical system of the apparatus and certain aspects of a control system for performing divided pattern-transfer methods using the apparatus.

An electron gun 1 is situated at the most upstream location in the electron-optical system shown in FIG. 3. The electron gun 1 emits a beam of electrons that propagate along an axis AX downstream of the electron gun 1. The electron beam propagating between the electron gun 1 and a reticle 10 is termed herein an "illumination beam" IB. Downstream of the electron gun 1 are first and second condenser lenses 3, 5, respectively. The illumination beam IB passes through the condenser lenses 3, 5 and forms a first crossover C.O.1 situated on the axis AX downstream of the second condenser lens 5.

The reticle 10 is a "divided" or "segmented" reticle that defines a pattern that is divided into multiple "exposure units" (also termed "subfields"). Downstream of the second condenser lens 5 is a "beam-shaping aperture" 6 that defines a desired transverse profile (e.g., rectangular) of the illumination beam IB. The beam-shaping aperture 6 is sized such that, as the illumination beam passes through it, the illumination beam is sufficiently trimmed to illuminate only one exposure unit of the reticle 10 at a time. For example, the beam-shaping aperture 6 forms the illumination beam IB to have a square profile for illuminating an exposure unit measuring (1 mm)$^2$ on the reticle. A third condenser lens 9 forms an image of the beam-shaping aperture 6 on the reticle 10.

A "blanking aperture" 7 is located downstream of the beam-shaping aperture 6 at the same axial position as the first crossover C.0.1. I.e., the first crossover C.0.1 is formed in the axial opening defined by the blanking aperture 7. An illumination-beam (IB) deflector 8 is situated downstream of the blanking aperture 7. The IB deflector 8 sequentially scans the illumination beam, primarily in the X-axis direction in the figure, to illuminate each exposure unit on the reticle as each exposure unit is brought within the field of the illumination-optical system. (The "illumination-optical system" is the electron-optical system shown in the figure that is located between the electron gun 1 and the reticle 10.) The third condenser lens 9 is situated below the IB deflector 8. The third condenser lens 9 collimates the illumination beam before the illumination beam strikes the reticle 10, thereby forming an image of the beam-shaping aperture 6 on the selected exposure unit.

FIG. 3 shows only one exposure unit of the reticle 10 (i.e., the exposure unit that is currently situated at the optical axis AX). However, it will be understood that the reticle 10 actually comprises an array (extending over an X-Y plane, defined by the reticle 10, that is perpendicular to the optical axis AX) of a large number of exposure units. Thus, the reticle 10 defines a pattern for a layer of a "chip" (semiconductor device).

The exposure units are illuminated individually and sequentially by the illumination beam 1B. To such end, the illumination beam 1B is appropriately deflected within the field of the illumination-optical system by the IB deflector 8. Meanwhile, the reticle 10 and substrate ("wafer") 15 are mechanically moved in synchrony as required to move exposure units on the reticle 10 into position for exposure and to move corresponding regions on the wafer 15 into position for exposure. The reticle 10 is mounted on a reticle stage 11 that is movable in the X and Y directions; and the wafer 15 is mounted on a wafer stage 16 that is also movable in the X and Y directions. Also, the exposure units on the reticle 10 are arranged in rows and columns extending in the X and Y directions. Thus, by synchronously scanning the reticle stage 11 and wafer stage 16 in opposite directions along the Y axis, the exposure units (on the reticle) extending in the Y direction are exposed one after the other. Both stages 11, 16 are equipped with a respective position-measurement system that utilizes laser interferometers to accurately determine stage position. Such accuracy is required for accurately stitching together demagnified images of exposure units on the wafer 15.

Situated downstream of the reticle 10 is a "projection-optical system" as described below. As the illumination beam IB passes through an illuminated exposure unit on the reticle 10, the beam becomes a "patterned beam" PB that propagates downstream of the reticle 10 to the wafer 15. The projection-optical system comprises first and second projection lenses 12, 14, respectively, that collectively constitute a "projection-lens system." The projection-lens system also includes at least one deflector 13.

Each exposure unit of the reticle 10 defines a respective portion of the overall pattern. Hence, each exposure unit defines a respective array of pattern features. In each exposure unit, pattern features are defined by a respective pattern of "white" and "black" portions of the exposure unit. In a stencil reticle, a "white" portion is represented by a void in the reticle membrane and a "black" portion is represented by a membrane region of the exposure unit. In a membrane reticle, a "white" portion is represented by a membrane region not overlaid with an electron-scattering or electron-absorbing material, and a "black" portion is represented by a membrane region including an overlaid electron-scattering or electron-absorbing material. As the illumination beam IB strikes a selected exposure unit on the reticle 10, electrons in the beam passing through the white portions of the reticle 10 are demagnified by the projection lenses 12, 14 and are appropriately deflected by the deflector 13 to form an image of the exposure unit at a prescribed location on the wafer 15. The wafer 15 is surficially coated with an appropriate resist that is sensitive to a prescribed dose of the patterned beam PB. I.e., as electrons of the patterned beam PB impinge on the resist, the resist becomes imprinted with a latent image of the respective exposure unit. Not shown in FIG. 3 are correction lenses and correction deflectors that can be placed in the vicinity of the projection lenses 12, 14 for achieving correction, as required, of the "demagnification ratio" (i.e., ratio of the size of the image on the wafer 15 to the size of the corresponding exposure unit on the reticle 10), image rotation, and any of various aberrations such as astigmatism and distortion.

A second crossover C.O.2 is formed at an axial location at which the axial distance between the reticle 10 and the wafer 15 is divided in proportion to the demagnification ratio of the projection-lens system. Coaxial with the second crossover C.O.2 is a "contrast aperture" 17 that shields the wafer 15 from electrons, in the patterned beam PB, that were scattered by the black portions of the reticle 10.

The lenses 3, 5, 9, 12, and 14, and the deflectors 8 and 13 are controlled, via respective power supplies 3a, 5a, 9a, 12a, 14a, 8a, and 13a, by a controller 21 connected to each of the power supplies. The controller 21 also controls movements of the reticle stage 11 and wafer stage 16 via respective stage drivers 11a and 16a. As the exposure units of the reticle 10 are sequentially illuminated by the illumination beam IB, the respective images of the illuminated exposure units are projected onto respective proper locations on the wafer 15. The demagnified images of the projected exposure units on the wafer are formed in positions such that, after completing exposure of all the exposure units, the images are accurately stitched together on the wafer to form a reduced image of the entire reticle pattern.

Figure 2A:
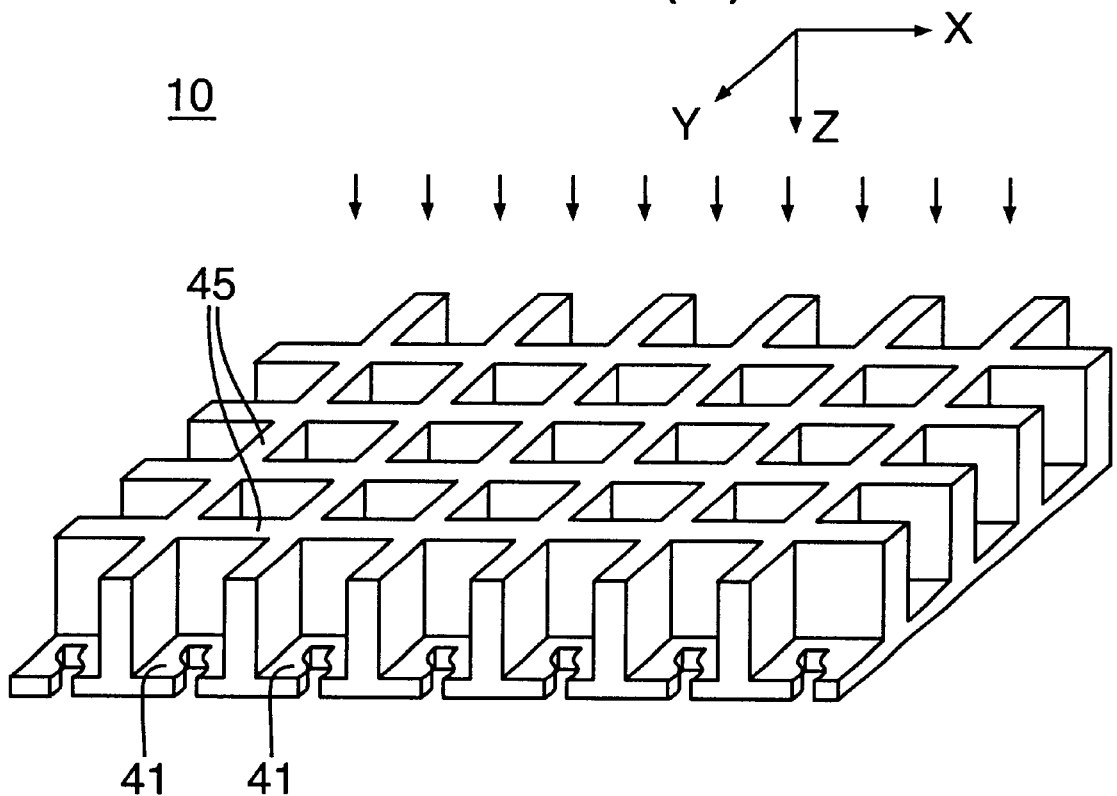
FIGS. 2(A)–2(B) are an isometric view and plan view, respectively, of a first embodiment of a reticle for electron-beam projection-exposure.
Figure 2B:
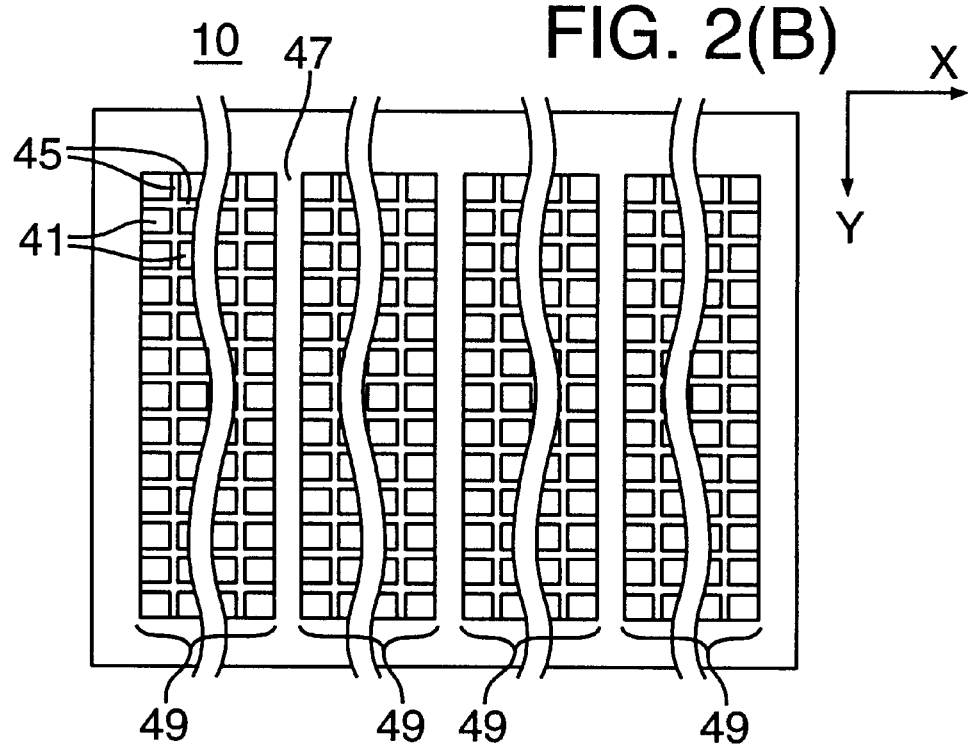

A detailed example of a representative embodiment of a reticle 10, according to the invention, for use in performing divided projection-exposure using an electron beam (as a representative charged particle beam) is shown in FIGS. 2(A) and 2(B). FIG. 2(A) is an isometric view, and FIG. 2(B) is a plan view. The regions denoted by the many squares 41 are respective membrane segments each having a thickness ranging from a tenth of a micrometer to a few micrometers. Each membrane segment 41 encompasses an area of the pattern corresponding to one exposure unit. As currently contemplated, on the reticle 10, the size of one exposure unit is (0.5 mm)$^2$ to (5 mm)$^2$. With a demagnification ratio of 1/5, the size of the demagnified projected image area (image field) of such an exposure unit on the wafer 15 is (0.1 mm)$^2$ to (1.0 mm)$^2$.

The reticle shown in FIG. 2(A) also includes "grillage" 45, which is an orthogonal lattice structure disposed around the individual membrane segments 41. The grillage 45 actually comprises an intersecting network of reinforcing struts each having a thickness in the Z direction of approximately 0.5–1.0 mm. The struts retain the mechanical integrity of the membrane portions and provide rigidity to the reticle 10. The width (in the X or Y direction) of each strut of the grillage 45 is approximately 100 μm.

As shown in FIG. 2(B), the membrane segments 41 are arranged in multiple rows extending in the X direction in the figure. Each such row is termed a "scan strip." A column (extending in the Y direction) of multiple scan strips is termed a "stripe" 49. The width of each stripe 49 (in the X direction) corresponds to the maximum beam deflection in the X direction that can be achieved with the illumination-optical system. Multiple stripes 49 are arranged side by side in the X direction across the reticle 10. Disposed between adjacent stripes 49 are broad struts 47 that serve to minimize overall sagging of the reticle 10 during use. Each of the broad struts 47 (all of which are desirably contiguous with the grillage 45) is approximately 0.5 to 1.0 mm thick in the Z direction and a few millimeters wide in the X direction.

To perform projection exposure, the scan strips in a stripe 49 are sequentially exposed by appropriately deflecting the illumination beam IB using the deflector 8. Successive scan strips in the stripe 49 are brought into position for exposure by scanning movements of the reticle stage 11 and wafer stage 16 in the Y direction. After completing exposure of one stripe 49, the next stripe is brought into position for exposure by respective motions of the reticle stage 11 and wafer stage 16 in the X direction.

During projection exposure of the reticle pattern, non-patterned regions such as "skirts" (not shown, but understood to be situated peripherally around each exposure unit immediately adjacent the respective struts) and the struts themselves are not illuminated or projected onto the wafer 15. Compensating motions of the wafer stage 16 are made relative to corresponding motions of the reticle stage 11 so as to properly stitch together, on the wafer 15, the images of the exposure units into a continuous full chip pattern. If the demagnification ratio is assumed to be 1/4 or 1/5, and if the assumed size of one chip on the wafer is 27×44 mm (for a 4-Gigabit DRAM), then the overall size of the chip pattern as defined on the reticle (including the non-patterned areas) is about 120 to 230 mm×150 to 350 mm.

Figure 1:
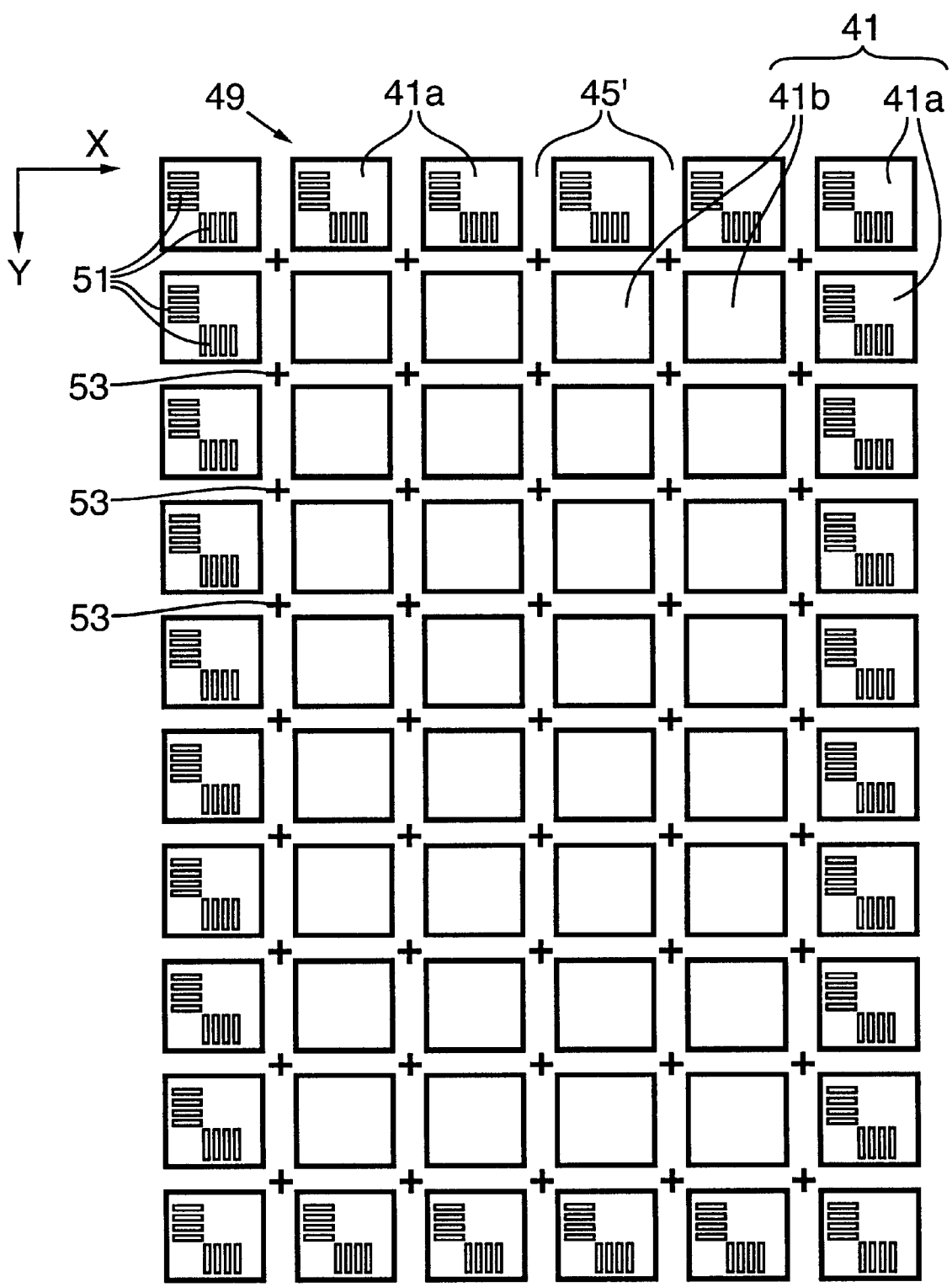
FIG. 1 is a plan view showing a placement of an alignment mark for one stripe of a reticle according to a representative embodiment of the present invention. The depicted view is from the wafer side (i.e., downstream side) of the reticle.

The placement of alignment marks on the reticle 10 according to a representative embodiment of the invention is shown in FIG. 1. More specifically, FIG. 1 is a plan view of a representative placement of alignment marks for an exemplary stripe 49 on the reticle 10 (as viewed from the wafer, or downstream, side of the reticle). In the stripe 49, membrane segments 41 defining respective exposure units are arranged in rows (extending in the X direction) and columns (extending in the Y direction). For the purposes of this discussion the membrane segments are referred to below as "subfields."

Of the subfields 41, the subfields 41a (i.e., those subfields located at the periphery of the stripe 49) are reserved areas for respective second alignment marks 51 for use with the charged particle beam. The subfields 41a do not define any features of the pattern; rather, each subfield 41a defines only a respective "CPB alignment mark" 51. Each CPB alignment mark 51 is desirably a stencil-type pattern of line-shaped voids with intervening spaces. Each CPB alignment mark 51 has an array of narrow rectangular voids (four voids are shown) extending in the X direction and an array of narrow rectangular voids (four voids are shown) extending in the Y direction. The stripe 49 also comprises a large number of "inner" subfields 41b each defining a representative portion of the reticle pattern.

The subfields 41a, 41b are separated from one another by flanking struts 45'. At locations where respective struts 45' intersect each other, first alignment marks ("optical alignment marks") 53 are defined. Each optical alignment mark 53 desirably has a "+" shape formed by vacuum deposition (or other suitable technique) of chromium or tantalum on the surface of the struts (the struts are formed from a silicon substrate). Thus, each inner subfield 41b is flanked by four optical alignment marks 53 adjacent the four respective corners of the subfield 41b. As a result, a center point between each set of four flanking optical alignment marks 53 coincides with the center of the respective subfield 41b. The optical alignment marks 53 are arranged in an array (extending in the X and Y directions) in which the marks are equally spaced from one another along coordinate axes of the reticle.

The alignment marks 51 and 53 are desirably formed simultaneously with formation of the reticle pattern by a suitable fabrication process including electron-beam lithography, vacuum deposition, and etching. As a result, the positioning accuracy of the alignment marks is the same as the positioning accuracy of respective pattern portions defined by the subfields.

Use of the alignment marks 51, 53 is now explained. After fabrication of the reticle 10, the reticle is calibrated by detecting the positions of the optical alignment marks 53 using a coordinates-measurement apparatus (such as a Nikon model 6I optical interference coordinates-measurement instrument). The calibration is performed to ascertain any distortion in the reticle (representing variations from ideal design values) that may have occurred during reticle fabrication. The measurements are typically performed subfield-by-subfield to reveal any variances such as positional or rotational displacements, or variations in the demagnification ratio (primary distortions) caused by reticle fabrication.

After calibration, the reticle 10 is mounted on the reticle stage 11 of the microlithographic projection-exposure apparatus. While mounted in such a manner, the positions of stencil marks 51 placed in the alignment-mark subfields 41a at the periphery of the stripes 49 are detected. Distortions at peripheral regions of a stripe 49 can arise, for example, during chucking of the reticle 10 onto the reticle stage 11. The measurements are performed using a TTR (through-the-reticle) scanning technique. Scanning is performed using a charged particle beam (e.g., electron beam) that passes (after passing through the respective mark 51 through a stencil reference mark (i.e., a reference mark on the wafer stage 16 or a mark provided on the wafer 15 for the measurement of reticle distortion). The reference marks desirably are configured with lines and intervening spaces extending in both the X and Y directions in a manner similar to the mark 51. The measured reticle distortion is usually manifest as distortion of the entire respective stripe 49. Local distortion of individual subfields 41 cannot be measured directly at this time.

Next, any distortions of individual subfields 41 are computed based upon optical measurements of distortions of individual subfields 41 and upon the in situ measurements of distortions at the stripe periphery as discussed above. Measurements of stripe-periphery distortion are matched up with individual subfield-distortion measurements to compute the position displacement, rotation displacement, and demagnification displacement of each subfield 41 in the stripe 49. The loading distortions of the subfields 41b in the interior regions of the stripes 49 are computed from the stripe-periphery loading distortion data (by interpolation, etc.).

A corrected exposure is then performed in which corrections are made by use of deflector(s), rotation correction lens(es), magnification-correction lens(es), etc., disposed as required in the projection-optical system.

Figure 4:
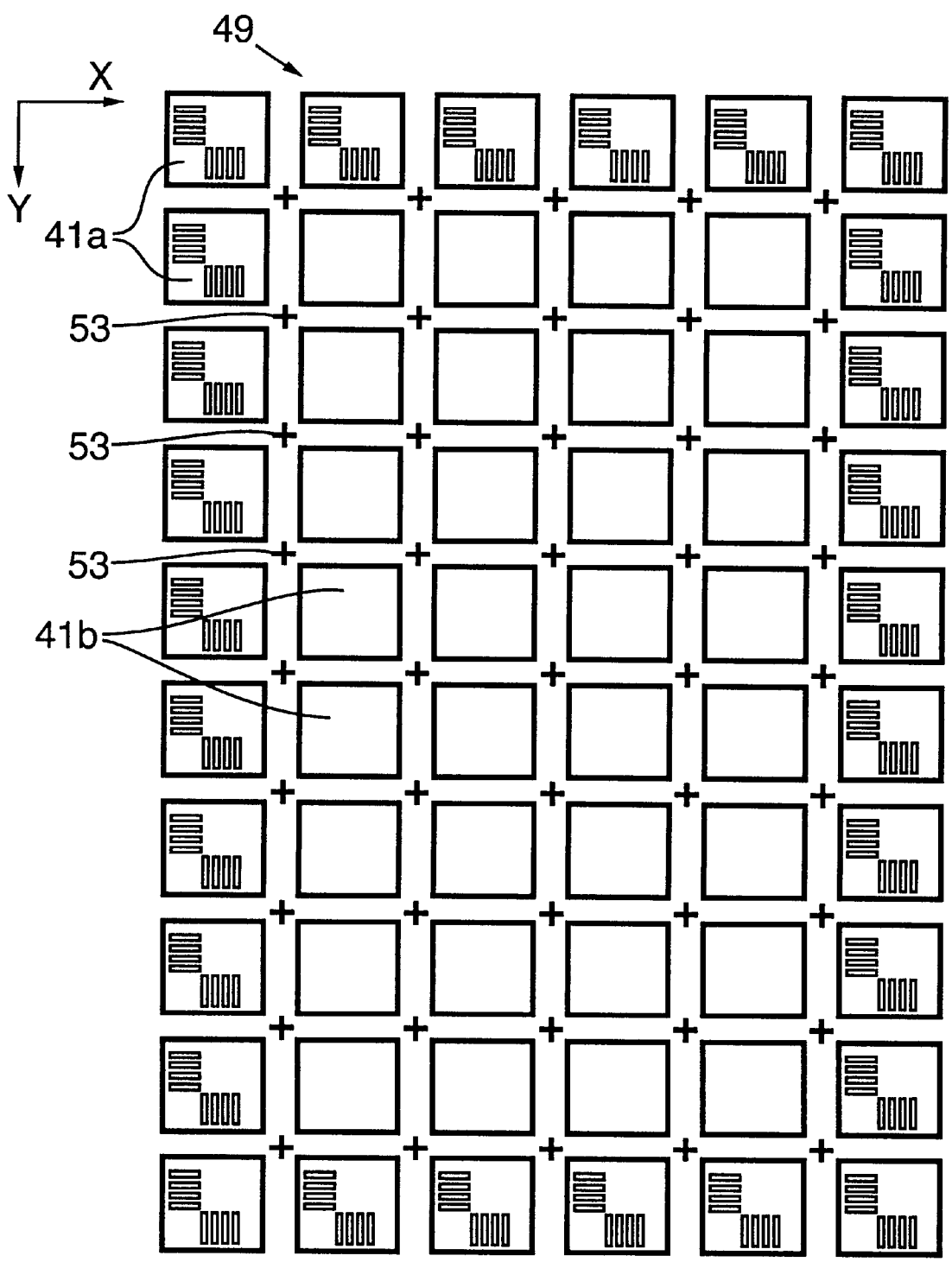
FIG. 4 is a plan view showing, conceptually, fabrication errors that can occur in one portion of a reticle.

A plan view of certain representative fabrication errors arising in a stripe 49 of a reticle 10 is conceptually shown in FIG. 4. Specifically, FIG. 4 shows variations in which subfields 41b, horizontally arrayed in the center portion of the stripe 49, are displaced slightly upward in the figure. The displacement of the center of each subfield 41b is determined from the average of the measured positions of the alignment marks 53 around the respective subfield 41b. Rotational displacements of individual subfields 41b are determined by measuring the rotation of the flanking alignment marks 53 around each respective subfield 41b. A demagnification error of an individual subfield 41b is determined by measuring the spacing intervals between the flanking alignment marks 53 around the respective subfield. Thus, pre-loading variations of the reticle 10 can be determined.

Figure 5:
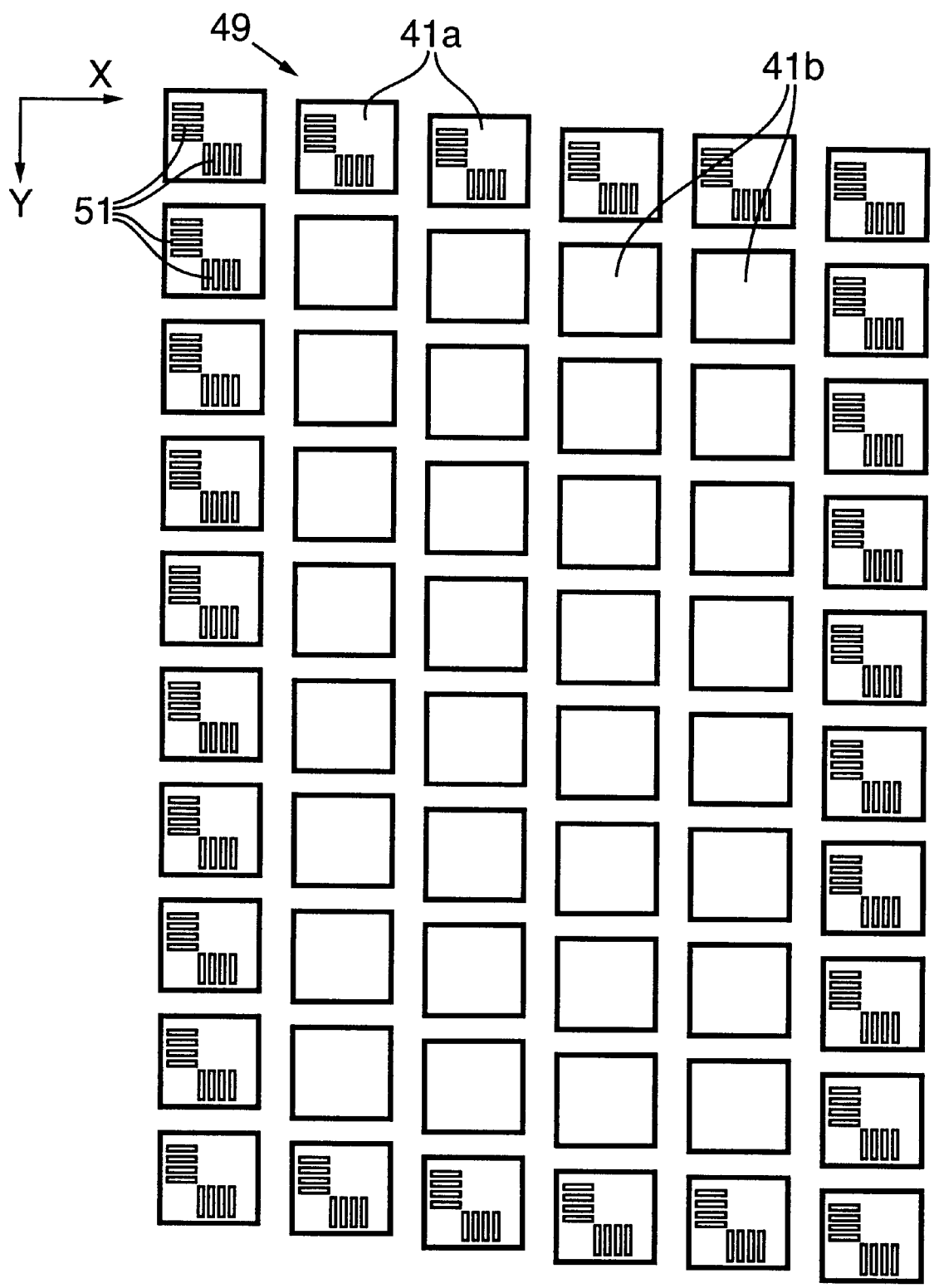
FIG. 5 is a plan view showing, conceptually, overall deformation of a stripe that can occur following the mounting of a reticle on a reticle stage.

A plan view conceptually showing an overall deformation of a stripe 49 after loading the reticle 10 is shown in FIG. 5. The FIG. 5 stripe 49 exhibits a post-loading parallelogram distortion in the downward direction that progressively worsens toward the right side of the stripe 49. This parallelogram distortion is measured from corresponding positional displacements of the alignment marks 51 formed in the subfields 41a at the periphery of the stripe 49. Such measurements can be performed by TTR scanning of the alignment marks 51 relative to reference marks on the wafer stage 16 or wafer 15. By interpolation of data obtained in such measurements, estimates can be obtained of the position and parallelogram distortion of each of the subfields 41b defining respective portions of the pattern.

Next, the loading distortion data are considered together with primary distortion data obtained outside of the microlithographic projection-exposure apparatus using the methods described above to compute the actual distortion, in the projection-exposure apparatus, of each of the subfields 41b. Adjustments as required to correct this distortion are then made to components in the projection-lens system (e.g., activation of deflectors, demagnification-ratio correcting lenses, and rotation-correction lenses) as required. Accurate projection exposure can then be performed.

Figure 8:
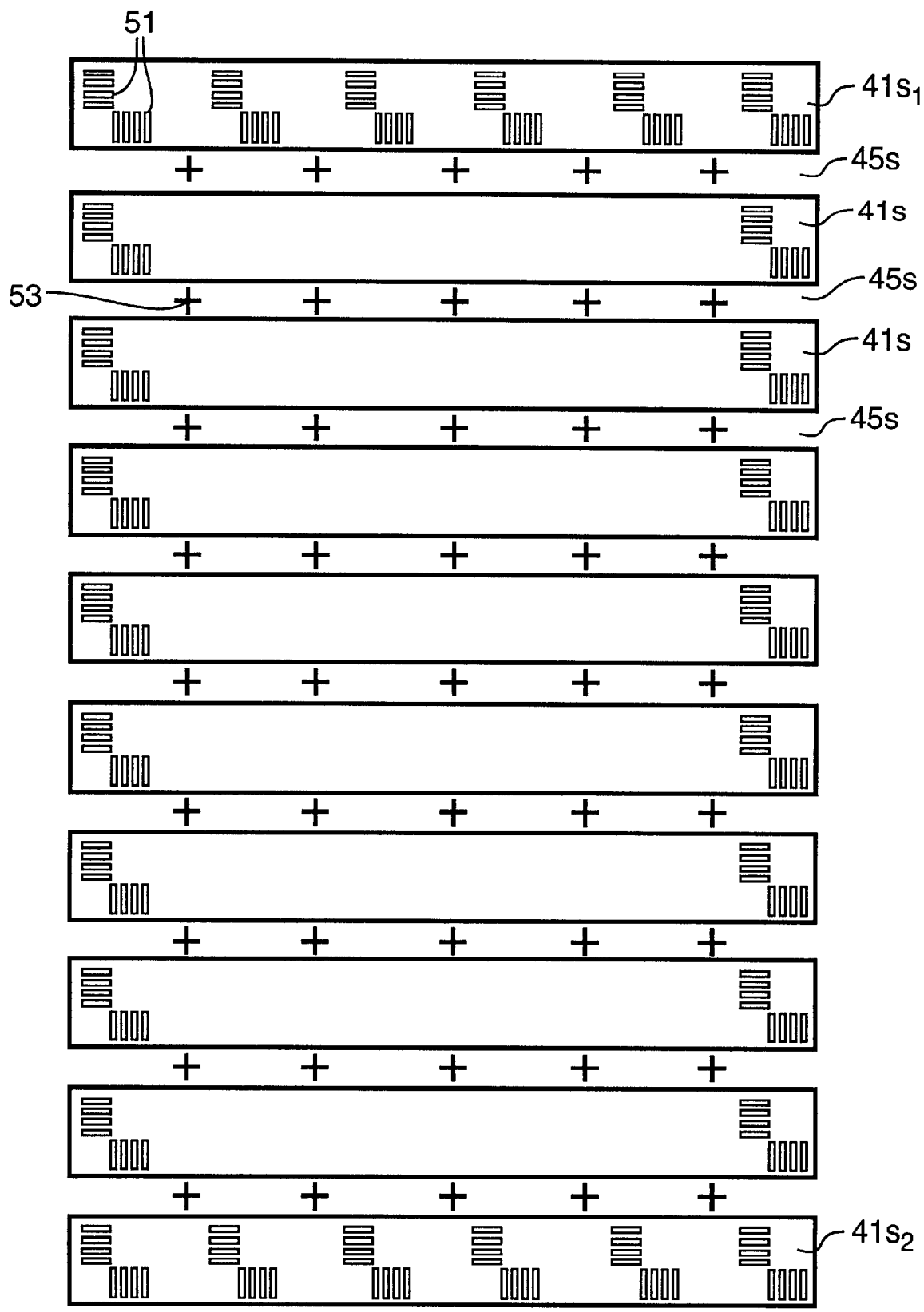
FIG. 8 is a plan view of a second embodiment of a reticle for electron-beam projection-exposure.

In the foregoing explanation, the reticle is divided into multiple subfields that can be individually projected onto corresponding regions of the substrate in respective "still shots." Alternatively, the present invention can be applied to another type of reticle that comprises parallel struts rather than intersecting struts. Such an alternative reticle is shown in FIG. 8, which comprises multiple linearly extended subfields 41s that are individually exposed in a respective scanning shot. Each subfield 41s comprises a membrane in which pattern features are defined as respective voids. Certain subfields $41s_1$, $41s_2$ include an array of second alignment marks 51 each having a profile as discussed above. Other subfields 41s include second alignment marks 51 as well as pattern features. The struts 45s include first alignment marks 53 configured and arrayed as discussed above. The optical field of a projection-optical system used to projection-expose a reticle as shown in FIG. 8 is not large enough to expose an entire subfield in one still shot. Rather, each subfield is exposed in a scanning manner ("scanning shot"). The first alignment marks 53 are spaced apart on the struts by about one optical field each, and the second alignment marks are spaced apart by about the same amount in the subfields $41s_1$, $41s_2$.

As is apparent from the foregoing, methods are provided (for use with CPB microlithographic projection-exposure) for quickly performing accurate corrections of reticle distortions caused by any of various factors.

Figure 6:
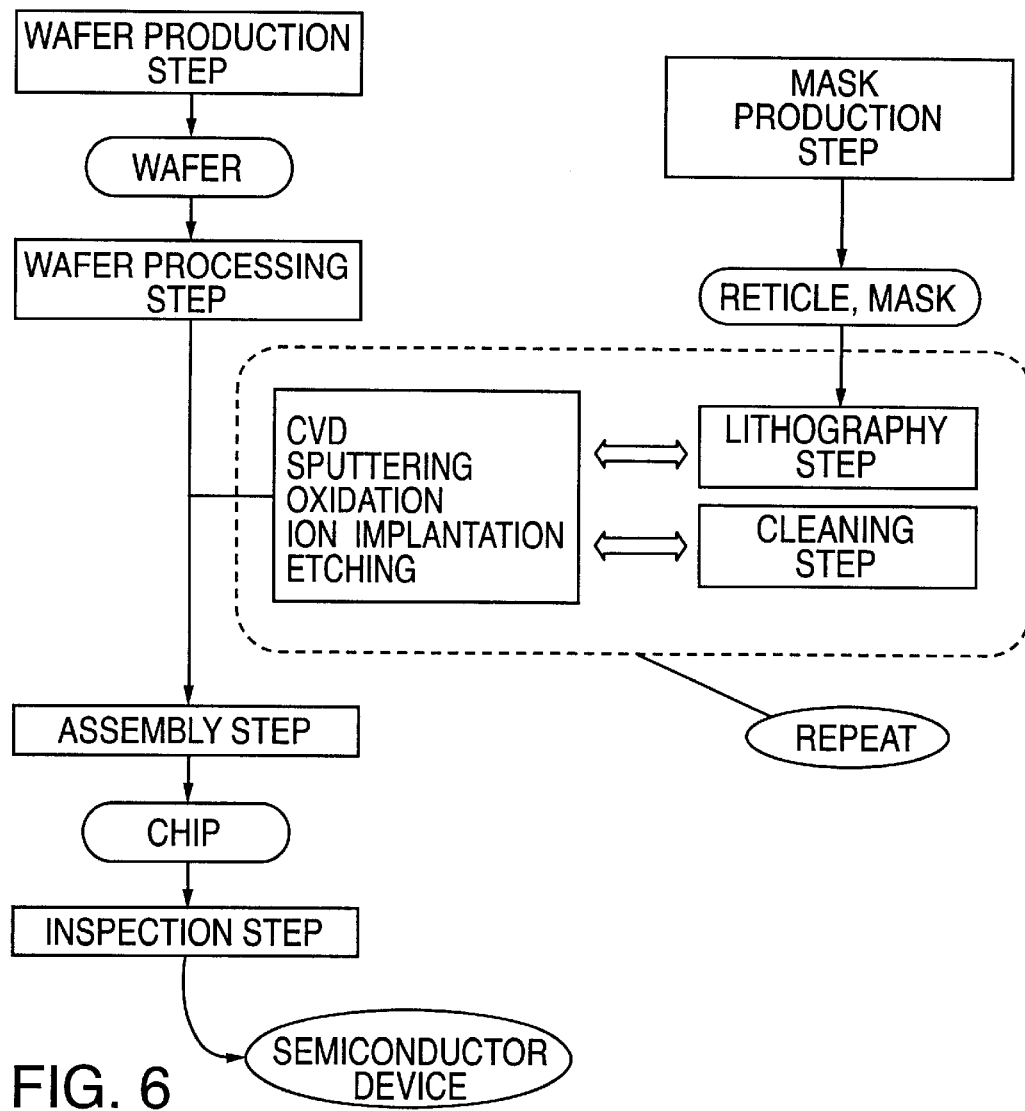
FIG. 6 is a process flowchart for manufacturing a semiconductor device, wherein the process includes a microlithography method according to the invention.

FIG. 6 is a flowchart of an exemplary semiconductor fabrication method to which apparatus and methods according to the invention can be readily applied. The fabrication method generally comprises the main steps of wafer production (wafer preparation), reticle production (reticle preparation), wafer processing, device assembly, and inspection. Each step usually comprises several sub-steps.

Among the main steps, wafer processing is key to achieving the smallest feature sizes (critical dimensions) and best inter-layer registration. In the wafer-processing step, multiple circuit patterns are successively layered atop one another on the wafer, wherein the formation of each layer typically involves multiple sub-steps. Usually, many operative semiconductor devices are produced on each wafer.

Typical wafer-processing steps include: (1) thin-film formation involving formation of a dielectric layer for electrical insulation or a metal layer for connecting wires; (2) microlithography to form a resist pattern for selective processing of the thin film or the substrate itself; (3) etching or analogous step to etch the thin film or substrate according to the resist pattern, or doping as required to implant ions or impurities into the thin film or substrate according to the resist pattern; (4) resist stripping to remove the resist from the wafer; and (5) chip inspection. Wafer processing is repeated as required (typically many times) to fabricate the desired semiconductor chips on the wafer.

Figure 7:
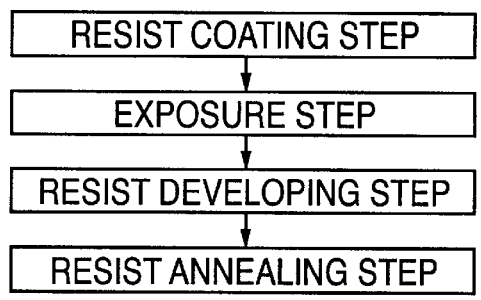
FIG. 7 is a process flowchart for performing a microlithography method that includes a projection-exposure method according to the invention.

FIG. 7 provides a flow chart of typical steps performed in microlithography, which is a principal step in wafer processing. The microlithography step typically includes: (1) resist-coating step, wherein a suitable resist is coated on the wafer substrate (which can include a circuit element formed in a previous wafer-processing step; (2) exposure step, to expose the resist with the desired pattern; (3) development step, to develop the exposed resist; and (4) annealing step, to enhance the durability of the resist pattern.

Methods and apparatus according to the invention can be applied to a semiconductor fabrication process, as summarized above, to provide substantially improved accuracy and resolution.

Whereas the invention has been described in connection with a representative embodiment, it will be apparent that the invention is not limited to that embodiment. On the contrary, the invention is intended to encompass all modifications, alternatives, and equivalents as may be included within the spirit and scope of the invention, as defined by the appended claims.

What is claimed is:

1. In a charged-particle-beam projection-exposure method including the steps of defining a pattern, to be transferred to a sensitive substrate, on a reticle segmented into multiple subfields each defining a respective portion of the pattern; individually illuminating subfields on the reticle using a charged-particle illumination beam to form a patterned beam propagating downstream of the reticle; and projection-imaging the patterned beam on desired respective locations on the sensitive substrate at which images of the subfields are stitched together to form the pattern, a method for measuring and correcting reticle distortion, comprising:

(a) defining first alignment marks on the reticle for measuring distortion of the reticle arising during fabrication of the reticle, and defining second alignment marks, separate from the first alignment marks, on the reticle for measuring distortion of the reticle arising from mounting the reticle on a reticle stage for use in projection-exposure of the pattern defined by the reticle;

(b) measuring positions of the first alignment marks to obtain data corresponding to a subfield-by-subfield profile of reticle distortion caused by fabrication of the reticle;

(c) mounting the reticle on the reticle stage;

(d) measuring positions of the second alignment marks to obtain data corresponding to a profile of reticle distortion caused by mounting the reticle on the reticle stage;

(e) combining the data obtained in steps (b) and (d) and processing the combined data to obtain a measurement of an actual distortion of each exposure unit of the reticle; and (f) during projection-exposure of the subfields, correcting any actual distortion of respective subfields as required by adjusting respective exposure parameters under which the respective subfields are exposed.

2. The method of claim 1, wherein:

the reticle comprises intersecting or parallel struts separating individual subfields from one another;

each subfield of the reticle comprises a respective membrane portion extending between respective struts such that each membrane portion is peripherally flanked by struts; and in step (a), the first alignment marks are defined on the struts.

3. The method of claim 2, wherein, in step (a), the first alignment marks are formed so as to provide a set of first alignment marks for each subfield of the reticle.

4. The method of claim 1, wherein, in step (b), the positions of the first alignment marks are detected using light.

5. The method of claim 1, wherein:

the reticle comprises intersecting or parallel struts separating individual subfields from one another;

each subfield of the reticle comprises a respective membrane portion extending between respective struts such that each membrane portion is peripherally flanked by struts; and in step (a), the second alignment marks are defined within multiple subfields.

6. The method of claim 5, further comprising the step of providing a reference mark on a substrate stage or on a substrate mounted to the substrate stage, wherein, in step (d), the second alignment marks are illuminated by a charged particle beam such that the reference mark is scanned by the charged particle beam passing through an individual second alignment mark and projection-imaged on the sensitive substrate.

7. The method of claim 6, wherein:

the subfields are arrayed on the reticle, the reticle comprising at least one stripe; and in step (a), the second alignment marks are defined in subfields situated around a periphery of the stripe.

8. The method of claim 7, wherein the second alignment marks are stencil marks defined in the membrane portion of the respective subfield.

9. A semiconductor-fabrication process, comprising the steps of:

(a) preparing a wafer;

(b) processing the wafer; and (c) assembling devices formed on the wafer during steps (a) and (b), wherein step (b) comprises a method for performing projection microlithography as recited in claim 1.

10. A semiconductor-fabrication process, comprising the steps of:

(a) preparing a wafer;

(b) processing the wafer; and (c) assembling devices formed on the wafer during steps (a) and (b), wherein step (b) comprises the steps of (i) applying a resist to the wafer; (ii) exposing the resist; developing the resist; and (iv) annealing the resist; and step (ii) comprises providing a charged-particle-beam projection-exposure apparatus as recited in claim 9; and using the charged-particle-beam projection-exposure apparatus to expose the resist with the pattern defined on the reticle.

11. A semiconductor device produced by the method of claim 10.

* * * * *

UNITED STATES PATENT AND TRADEMARK OFFICE
CERTIFICATE OF CORRECTION

PATENT NO. : 6,277,532 B1
DATED : August 21, 2001
INVENTOR(S) : Yahiro

It is certified that error appears in the above-identified patent and that said Letters Patent is hereby corrected as shown below:

Column 2,
Line 45, change "to obtained" to -- to be obtained --.

Column 14,
Line 39, change "developing" to -- (iii) developing --.

Signed and Sealed this

Twenty-third Day of April, 2002

Attest:

Attesting Officer

JAMES E. ROGAN
Director of the United States Patent and Trademark Office